US008842709B2

(12) United States Patent
Takeda et al.

(10) Patent No.: US 8,842,709 B2
(45) Date of Patent: Sep. 23, 2014

(54) SURFACE EMITTING SEMICONDUCTOR LASER, MANUFACTURING METHOD FOR SURFACE EMITTING SEMICONDUCTOR LASER, SURFACE EMITTING SEMICONDUCTOR LASER DEVICE, OPTICAL TRANSMISSION DEVICE, AND INFORMATION PROCESSING DEVICE

(71) Applicant: Fuji Xerox Co., Ltd., Tokyo (JP)

(72) Inventors: Kazutaka Takeda, Kanagawa (JP); Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/910,553

(22) Filed: Jun. 5, 2013

(65) Prior Publication Data
US 2014/0044438 A1 Feb. 13, 2014

(30) Foreign Application Priority Data

Aug. 7, 2012 (JP) ................................. 2012-174544

(51) Int. Cl.
*H01S 5/00* (2006.01)
*H01S 5/183* (2006.01)
*H01S 5/343* (2006.01)
*H01S 5/022* (2006.01)

(52) U.S. Cl.
CPC .............. *H01S 5/183* (2013.01); *H01S 5/3432* (2013.01); *H01S 5/18394* (2013.01); *H01S 5/18391* (2013.01); *H01S 5/02288* (2013.01); *H01S 5/18361* (2013.01); *H01S 5/18313* (2013.01); *H01S 2301/166* (2013.01)
USPC ................ 372/50.124; 372/43.01; 372/44.01; 372/45.01; 372/46.01; 372/50.11

(58) Field of Classification Search
USPC ........ 372/43.01, 44.01, 45.01, 46.01, 50, 124
See application file for complete search history.

(56) References Cited

U.S. PATENT DOCUMENTS

| 5,555,255 A * | 9/1996 | Kock et al. ....................... 372/96 |
| 2003/0026308 A1 | 2/2003 | Iwai et al. |
| 2003/0156613 A1 * | 8/2003 | Uenohara et al. ............... 372/46 |
| 2011/0217077 A1 | 9/2011 | Harasaka et al. |
| 2013/0243023 A1 * | 9/2013 | Kondo ........................ 372/45.01 |

FOREIGN PATENT DOCUMENTS

| JP | 2001-156395 A | 6/2001 |
| JP | 2003-115634 A | 4/2003 |
| JP | 2004-529487 A | 9/2004 |
| JP | 2006-210429 A | 8/2006 |
| JP | 2010-153768 A | 7/2010 |
| WO | 02/45217 A2 | 6/2002 |

* cited by examiner

*Primary Examiner* — Dung Nguyen
(74) *Attorney, Agent, or Firm* — Sughrue Mion, PLLC

(57) ABSTRACT

A surface emitting semiconductor laser includes a first semiconductor multilayer reflector of a first conductivity type, an active area, a second semiconductor multilayer reflector of a second conductivity type, a current confinement layer having a conductive area and a surrounding high-resistance area, each provided on a substrate, and a higher-order transverse mode suppressing layer formed on an emission surface from which laser light is emitted and in an area in which higher-order transverse mode is induced. The higher-order transverse mode suppressing layer includes first to third insulation films having first to third refractive indices, respectively, formed on each other, and capable of transmitting an oscillation wavelength. The second refractive index is lower than the first refractive index. The third refractive index is higher than the second refractive index. The optical film thickness of the first to third insulation films is an odd number times one-fourth of the oscillation wavelength.

14 Claims, 8 Drawing Sheets

FIG. 2

| | CONFIGURATION OF OUTER PERIPHERY | REFLECTIVITY (%) |
|---|---|---|
| EXEMPLARY EMBODIMENT | 3-LAYER INSULATION FILM STRUCTURE | 97.2% |
| COMPARATIVE STRUCTURE 1 | SINGLE-LAYER INSULATION FILM STRUCTURE (SiN: 0.1 μm) | 98.1% |
| COMPARATIVE STRUCTURE 2 | WITHOUT INSULATION FILM (WITH ONLY UPPER DBR) | 99.5% |

SURFACE EMITTING SEMICONDUCTOR LASER, MANUFACTURING METHOD FOR SURFACE EMITTING SEMICONDUCTOR LASER, SURFACE EMITTING SEMICONDUCTOR LASER DEVICE, OPTICAL TRANSMISSION DEVICE, AND INFORMATION PROCESSING DEVICE

CROSS-REFERENCE TO RELATED APPLICATIONS

This application is based on and claims priority under 35 USC 119 from Japanese Patent Application No. 2012-174544 filed Aug. 7, 2012.

BACKGROUND

Technical Field

The present invention relates to a surface emitting semiconductor laser, a manufacturing method for a surface emitting semiconductor laser, a surface emitting semiconductor laser device, an optical transmission device, and an information processing device.

SUMMARY

According to an aspect of the present invention, there is provided a surface emitting semiconductor laser including, provided on a substrate, a first semiconductor multilayer reflector of a first conductivity type, an active area, a second semiconductor multilayer reflector of a second conductivity type, a current confinement layer having a conductive area and a surrounding high-resistance area, and a higher-order transverse mode suppressing layer formed on an emission surface from which laser light is emitted and in an area in which higher-order transverse mode is induced, in which the higher-order transverse mode suppressing layer includes a first insulation film, a second insulation film formed on the first insulation film, and a third insulation film formed on the second insulation film, the first insulation film having a first refractive index and capable of transmitting an oscillation wavelength, the second insulation film having a second refractive index and capable of transmitting the oscillation wavelength, and the third insulation film having a third refractive index and capable of transmitting the oscillation wavelength, and the second refractive index is lower than the first refractive index, the third refractive index is higher than the second refractive index, and an optical film thickness of the first insulation film, the second insulation film, and the third insulation film is an odd number times one-fourth of the oscillation wavelength.

BRIEF DESCRIPTION OF THE DRAWINGS

Exemplary embodiments of the present invention will be described in detail based on the following figures, wherein:

FIG. 2 is a table showing an example of the reflectivity of the first exemplary embodiment of the present invention and the respective reflectivities of comparative structures;

DETAILED DESCRIPTION

In order to achieve further speed-up of printers, image formation devices, etc., high-power surface emitting semiconductor lasers with fundamental transverse mode are sought after. In order to obtain fundamental transverse mode with surface emitting semiconductor lasers of an oxidation confinement structure according to the related art, it is necessary to reduce the size of an oxidation aperture to as small as approximately 2 to 3 μm. With such an oxidation aperture diameter, however, it is difficult to stably obtain a fundamental transverse mode output of 3 mW or more. On the other hand, a larger oxidation aperture diameter enables a higher output, but induces multimode oscillation. Among promising technologies for maintaining fundamental transverse mode even if the oxidation aperture diameter is increased, there is a technology in which an insulation film is provided on an emission surface to suppress oscillation of higher-order transverse mode.

Specifically, providing a structure (an insulation film or a dielectric film) on an emission surface such that the reflectivity of an area in which higher-order transverse mode is induced is lower than the reflectivity of an area in which fundamental transverse mode is induced causes a difference in reflectivity between fundamental transverse mode and higher-order transverse mode, which enables an increase in output of fundamental mode oscillation while suppressing oscillation of higher-order transverse mode. However, the reflectivity of a surface emitting semiconductor laser is mostly determined by the structure of distributed Bragg reflectors (DBRs). Therefore, it is still difficult to obtain a large difference in reflectivity between fundamental transverse mode and higher-order transverse mode even if an insulation film that serves as a structure for suppressing higher-order transverse mode is provided on an emission surface. If the higher-order transverse mode is not sufficiently suppressed, a higher output may not be obtained by increasing the size of an oxidation aperture. Even if a large difference in reflectivity is obtained, meanwhile, higher-order transverse mode may not be suppressed stably when fluctuations in processes are large.

In the following, a surface emitting semiconductor laser of an oxidation confinement structure will be described, and will be referred to as a "vertical cavity surface emitting laser (VCSEL)". It should be noted, however, that the drawings are exaggerated to facilitate understanding of the characteristics of the present invention, and not necessarily to scale with respect to the actual devices.

Exemplary Embodiments

Figure 1A:
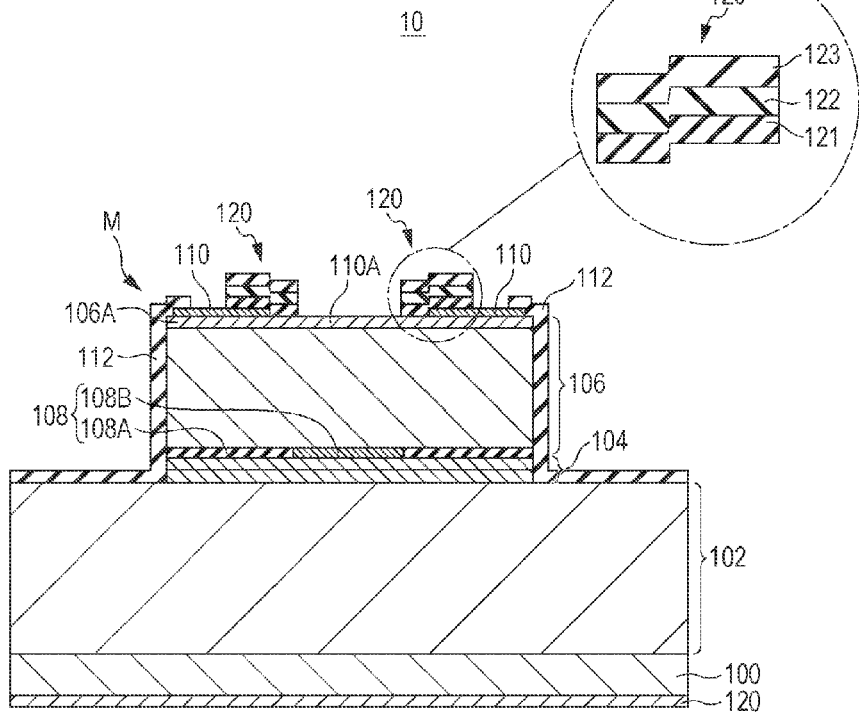
FIG. 1A is a schematic cross-sectional view of a surface emitting semiconductor laser according to a first exemplary embodiment of the present invention.

FIG. 1A is a schematic cross-sectional view of a VCSEL according to a first exemplary embodiment of the present invention. As shown in the drawing, a VCSEL 10 according to the exemplary embodiment includes an n-type GaAs substrate 100, an n-type lower distributed Bragg reflector (hereinafter abbreviated as "DBR") 102 which is formed on the substrate 100 and in which AlGaAs layers with different Al compositions are superposed alternately, an active area 104 formed on the lower DBR 102 and including a quantum well layer and sandwiching upper and lower spacer layers, and a p-type upper DBR 106 which is formed on the active area 104 and in which AlGaAs layers with different Al compositions are superposed alternately.

The n-type lower DBR 102 is a stack of plural pairs of an $Al_{0.9}Ga_{0.1}As$ layer and an $Al_{0.3}Ga_{0.7}As$ layer, for example. Each of the layers has a thickness of $\lambda/4n_r$ (where $\lambda$ is the oscillation wavelength and $n_r$ is the refractive index of the medium). The layers are stacked alternately in 40 pairs. The carrier concentration after being doped with silicon which is n-type impurity is $3\times10^{18}$ $cm^{-3}$, for example.

The lower spacer layer of the active area 104 is an undoped $Al_{0.6}Ga_{0.4}As$ layer. The quantum well active layer includes an undoped $Al_{0.11}Ga_{0.89}As$ quantum well layer and an undoped $Al_{0.3}Ga_{0.7}As$ barrier layer. The upper spacer layer is an undoped $Al_{0.6}Ga_{0.4}As$ layer.

The p-type upper DBR 106 is a stack of plural pairs of an $Al_{0.9}Ga_{0.1}As$ layer and an $Al_{0.3}Ga_{0.7}As$ layer, for example. Each of the layers has a thickness of $\lambda/4n_r$. The layers are stacked alternately in 22 pairs. The carrier concentration after being doped with carbon which is p-type impurity is $3\times10^{18}$ $cm^{-3}$, for example. In addition, a contact layer 106A formed from p-type GaAs is formed as the uppermost layer of the upper DBR 106. A current confinement layer 108 formed from p-type AlAs or AlGaAs is formed inside the upper DBR 106. The current confinement layer 108 is preferably provided in proximity to the active area 104, and may be formed as the lowermost layer of the upper DBR 106.

A cylindrical mesa (columnar structure) M is formed on the substrate 100 by etching semiconductor layers ranging from the upper DBR 106 to a part of the lower DBR 102. The current confinement layer 108 is exposed to a side surface of the mesa M, and includes an oxidized area 108A selectively oxidized from the side surface and a conductive area (oxidation aperture) 108B surrounded by the oxidized area 108A. In an oxidation process for the current confinement layer 108, the rate of the oxidation of the AlAs layer is higher than that of the AlGaAs layer of the DBR, and the oxidation progresses inward from the side surface of the mesa M at a substantially constant rate. Therefore, the shape of the conductive area 108B in a plane parallel to the principal surface of the substrate 100 is circular, reflecting the outer shape of the mesa M, with the center of the circular shape matching the center of the mesa M in the axial direction, that is, the optical axis. The diameter D1 of the conductive area 108B may be determined so as to cause oscillation of higher-order transverse mode, and may be 5 microns or more in a wavelength band of 780 nm, for example.

An annular p-side electrode 110 made of a metal is formed on top of the mesa M. The p-side electrode 110 is formed from a stacked metal of Au, Ti/Au, or the like, for example, and connected to the contact layer 106A of the upper DBR 106 through an ohmic contact. A circular opening is formed in the center of the p-side electrode 110, and defines a light emission port 110A. The diameter of the light emission port 110A is larger than the diameter of the conductive area 108B. The center of the light emission port 110A substantially matches the center of the conductive area 108B. An interlayer insulation film 112 is formed to cover the bottom surface, the side surface, and the periphery of the top portion of the mesa M. The p-side electrode 110 is connected to an electrode pad via a lead wire (not shown).

An annular higher-order transverse mode suppressing layer 120 formed from a multilayer structure of insulation films or dielectric films is formed on a portion of an emission surface exposed by the light emission port 110A of the p-side electrode 110. The higher-order transverse mode suppressing layer 120 includes a first insulation film 121, a second insulation film 122, and a third insulation film 123.

The first insulation film 121 is formed from a material with a refractive index $n_1$ and capable of transmitting light at the oscillation wavelength. The film thickness of the first insulation film 121 is an odd number times one-fourth of the oscillation wavelength $\lambda$, that is, $(2a-1)\lambda/4n_1$ (where a is a natural number, $\lambda$ is the oscillation wavelength, and $n_1$ is the refractive index). The first insulation film 121 is formed from a material such as SiON, $SiO_2$, SiN, or $TiO_2$, for example. In the illustrated example, the outside diameter of the first insulation film 121 is larger than the size of the light emission port 110A so that the first insulation film 121 extends on the p-side electrode 110. However, the outside diameter of the first insulation film 121 may be equal to the size of the light emission port 110A.

The second insulation film 122 is formed on the first insulation film 121. The second insulation film 122 is formed from a material with a refractive index $n_2$ and capable of transmitting light at the oscillation wavelength. In an example, the second insulation film 122 is patterned in the same shape as that of the first insulation film 121. The refractive index $n_2$ of the second insulation film 122 is lower than the refractive index $n_1$ of the first insulation film 121. In addition, the film thickness of the second insulation film 122 is an odd number times one-fourth of the oscillation wavelength $\lambda$, that is, $(2b-1)\lambda/4n_2$ (where b is a natural number, $n_2$ is the refractive index, and $n_2<n_1$). The second insulation film 122 is formed from a material such as SiON, $SiO_2$, SiN, or $TiO_2$, for example.

The third insulation film 123 is formed on the second insulation film 122. The third insulation film 123 is formed from a material with a refractive index $n_3$ and capable of transmitting light at the oscillation wavelength. In an example, the third insulation film 123 is patterned in the same shape as that of the first insulation film 121. The refractive index $n_3$ of the third insulation film 123 is larger than the refractive index $n_2$ of the second insulation film 122. In addition, the film thickness of the third insulation film 123 is an odd number times one-fourth of the oscillation wavelength $\lambda$, that is, $(2c-1)\lambda/4n_3$ (where c is a natural number, $n_3$ is the refractive index, and $n_2<n_3$). The third insulation film 122 is formed from a material such as SiON, $SiO_2$, SiN, or $TiO_2$, for example.

In an exemplary embodiment, the interlayer insulation film 112 is formed from the same material as that of the third insulation film 123, and the third insulation film 123 and the interlayer insulation film 112 are patterned at the same time.

Figure 1B:
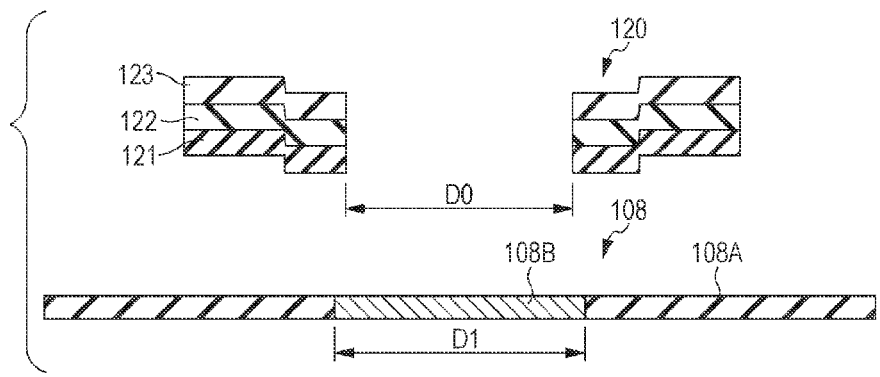
FIG. 1B illustrates the relationship between the respective sizes D0 and D1 of a higher-order transverse mode suppressing layer and a current confinement layer.

The inside diameter D0 of the higher-order transverse mode suppressing layer 120 corresponds to an area in which fundamental transverse mode of laser light is induced. Preferably, the inside diameter D0 of the higher-order transverse mode suppressing layer 120 is smaller than the diameter D1 of the conductive area 108B of the current confinement layer 108 as shown in FIG. 1B. The higher-order transverse mode suppressing layer 120 with a structure in which the first to third insulation films 121 to 123 are stacked on each other is formed on the emission surface (contact layer 106A).

In an example, the first insulation film 121 is made of SiN ($n_1=1.92$), the second insulation film 122 is made of SiON ($n_2=1.57$), and the third insulation film 123 is made of SiN ($n_3=1.92$). In this case, as shown in FIG. 2, the theoretical calculated value of the reflectivity of the upper DBR 106 including the higher-order transverse mode suppressing layer 120 is 97.2%. On the other hand, the reflectivity of the upper DBR 106 with no such higher-order transverse mode suppressing layer 120 formed is 99.5%. This indicates that provision of the higher-order transverse mode suppressing layer 120 results in a reduction in reflectivity of 2% or more, or about 2% or more. In other words, there is a difference in reflectivity of 2.3% between the area (inside diameter: D0) in which fundamental transverse mode is induced and the area in which higher-order transverse mode is induced. Another comparative example in which a single insulation film (made of SiN and having a film thickness of 0.1 μm) is formed in place of the higher-order transverse mode suppressing layer results in a reflectivity of 98.1%.

In the exemplary embodiment described above, the higher-order transverse mode suppressing layer 120 is formed from a set of the first to third insulation films 121 to 123. However, the present invention is not limited to such a configuration, and the higher-order transverse mode suppressing layer may be formed from plural sets of the first to third insulation films 121 to 123 stacked on each other.

Figure 3:
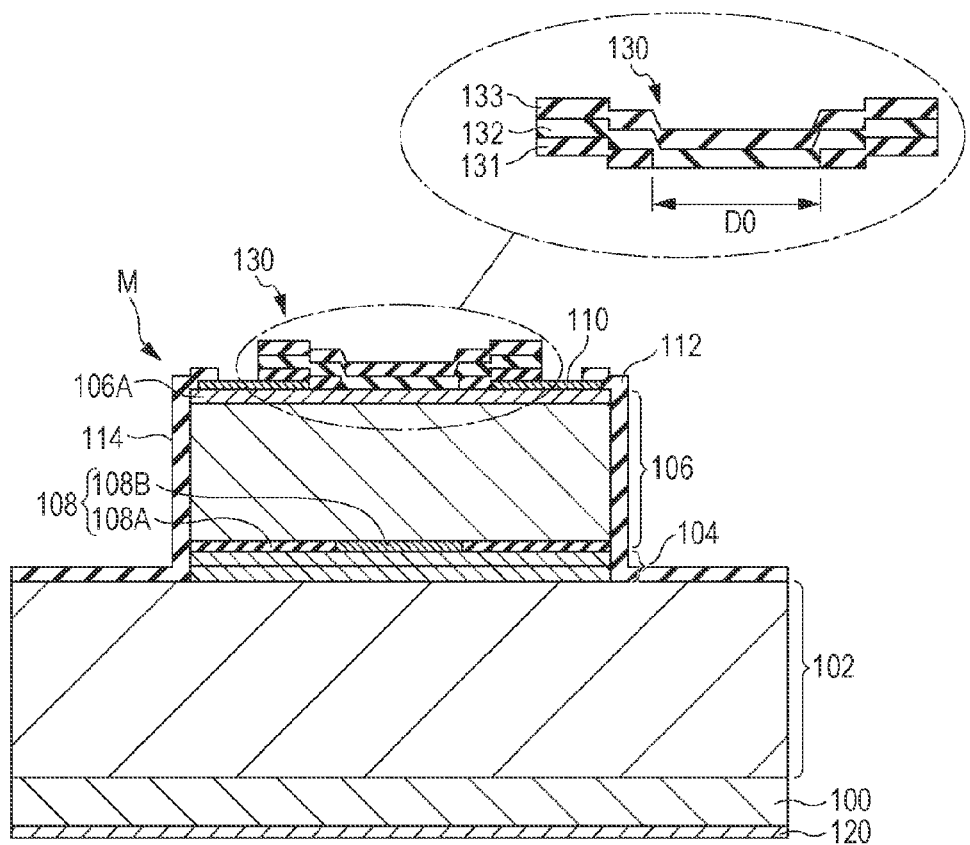
FIG. 3 is a schematic cross-sectional view of a surface emitting semiconductor laser according to a second exemplary embodiment of the present invention.

Next, a second exemplary embodiment of the present invention will be described. FIG. 3 is a schematic cross-sectional view of a VCSEL 10A according to the second exemplary embodiment. While higher-order transverse mode is principally suppressed in the first exemplary embodiment, fundamental transverse mode is promoted in addition to suppressing higher-order transverse mode in the second exemplary embodiment. First, second, and third insulation films 131, 132, and 133 according to the second exemplary embodiment are configured in the same manner as the first, second, and third insulation films 121, 122, and 123 according to the first exemplary embodiment.

In the VCSEL 10A according to the second exemplary embodiment, as shown in FIG. 3, a reflectivity adjustment layer 130 is formed to cover the entire light emission port 110A. The reflectivity adjustment layer 130 includes a higher-order transverse mode suppressing layer 120 such as that in the first exemplary embodiment, and a fundamental transverse mode promoting layer provided inside the higher-order transverse mode suppressing layer 120. That is, the reflectivity adjustment layer 130 includes a higher-order transverse mode suppressing layer provided in an area in which higher-order transverse mode oscillation is caused and having a three-layer structure including the first insulation film 131, the second insulation film 132, and the third insulation film 133 as in the first exemplary embodiment, and a fundamental transverse mode promoting layer provided in an area in which fundamental transverse mode oscillation is caused inside the reflectivity adjustment layer 130 and having a two-layer structure including the second insulation film 132 and the third insulation film 133. It should be noted, however, only the first insulation film 131 is formed in an annular shape to expose the light emission port 110A unlike the first exemplary embodiment. The second insulation film 132 and the third insulation film 133 extend to the area in which fundamental transverse mode oscillation is caused from the higher-order transverse mode suppressing layer 120. With the second insulation film 132 having a refractive index $n_2$ and an optical film thickness of an odd number times $\lambda/4$ and the third insulation film 133 having a refractive index $n_3$ and an optical film thickness of an odd number times $\lambda/4$ stacked on the light emission port 110A, the reflectivity of the area in which fundamental transverse mode is induced is higher than that with the second insulation film 132 and the third insulation film 133 not stacked on the light emission port 110A.

Next, a third exemplary embodiment of the present invention will be described. A difference in phase between light emitted in fundamental transverse mode and light emitted in higher-order transverse mode causes light in higher-order transverse mode to be emitted at the skirt portion of fundamental transverse mode, which may cause a diffraction pattern around the beam diameter. Thus, in the third exemplary embodiment, the film thickness of the higher-order transverse mode suppressing layer 120 or the reflectivity adjustment layer 130 is optimized.

In an example of the third exemplary embodiment, the film thickness h1 of the first insulation film 121, 131 is set to such a film thickness that meets the following relationship:

$$h1 = \frac{\lambda}{4n_1}(2i+1)$$

and $$\cos\left[\frac{2\pi h1}{\lambda}(n_0 - n_1)\right] \geq 0.8$$

where i is an integer and $n_0$ is the refractive index of air.

The theoretical value of the film thickness h1 for resolving a difference in phase in the first and second exemplary embodiments is 0.85 μm. When the film thickness h1 of the first insulation film 121, 131 is set to $\lambda \times 9/4 = 0.91$ μm, an optimum value that is approximate to the theoretical value may be obtained.

Next, a manufacturing method for the VCSEL 10A according to the second exemplary embodiment of the present invention will be described with reference to FIGS. 4A to 4C and 5D to 5F. First, a metal organic chemical vapor deposition (MOCVD) method is used to deposit, on an n-type GaAs substrate 100, an n-type lower DBR 102 in which an $Al_{0.9}Ga_{0.1}As$ layer and an $Al_{0.3}Ga_{0.7}As$ layer with a carrier concentration of $3 \times 10^{18}$ cm$^{-3}$ are stacked alternately in 40 pairs such that the film thickness of each of the layers is one-fourth of the in-medium wavelength, an active area 104 including an undoped $Al_{0.6}Ga_{0.4}As$ lower spacer layer, an undoped $Al_{0.11}Ga_{0.89}As$ quantum well layer and an undoped $Al_{0.3}Ga_{0.7}As$ barrier layer, and an undoped $Al_{0.6}Ga_{0.4}As$ upper spacer layer, and a p-type upper DBR 106 in which an $Al_{0.9}Ga_{0.1}As$ layer and an $Al_{0.3}Ga_{0.7}As$ layer with a carrier concentration of $3 \times 10^{18}$ cm$^{-3}$ are stacked alternately in 22 pairs such that the film thickness of each of the layers is one-fourth of the in-medium wavelength. A p-type GaAs contact layer 106A with a carrier concentration of $1 \times 10^{19}$ cm$^{-3}$ is formed as the uppermost layer of the upper DBR 106.

A p-type AlAs layer 108 is formed as the lowermost layer of or inside the upper DBR 106. Although not specifically described here, a buffer layer may be interposed between the substrate 100 and the lower DBR 102.

Figure 4A:
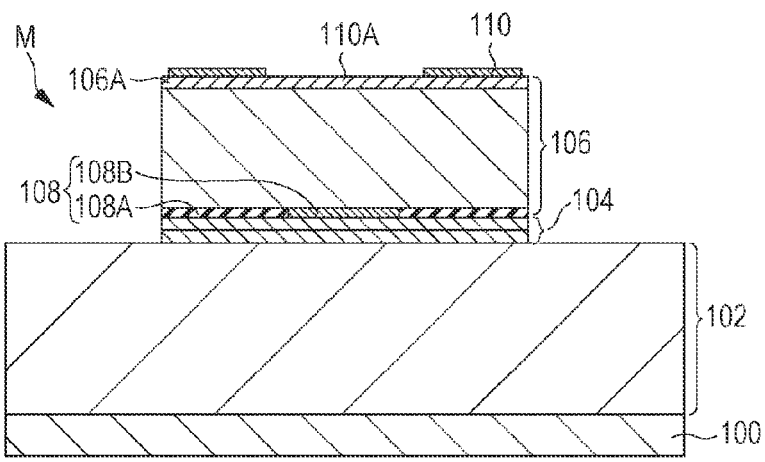
FIGS. 4A to 4C are each a schematic cross-sectional view illustrating manufacturing processes for the surface emitting semiconductor laser according to the second exemplary embodiment of the present invention.

Then, as shown in FIG. 4A, a photolithography process known in the art is used to form a mesa M on the substrate 100 by etching such as reactive ion etching (RIE), and an oxidation process is used to form an oxidized area 108A in the current confinement layer 108 in the mesa M. The diameter D1 of a conductive area 108B is 5 μm or more, for example. Next, a resist pattern is formed on the contact layer 106A, and an annular p-side electrode 110 made of Au/Ti is formed on the contact layer 106A by a lift-off process.

Figure 4B:
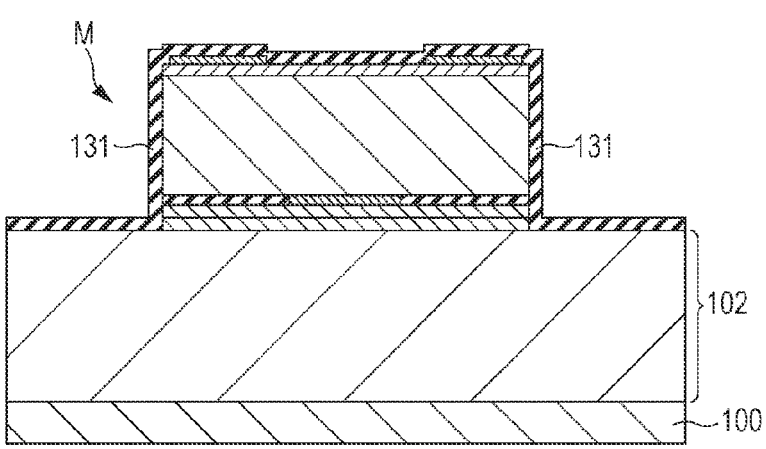
Figure 4C:
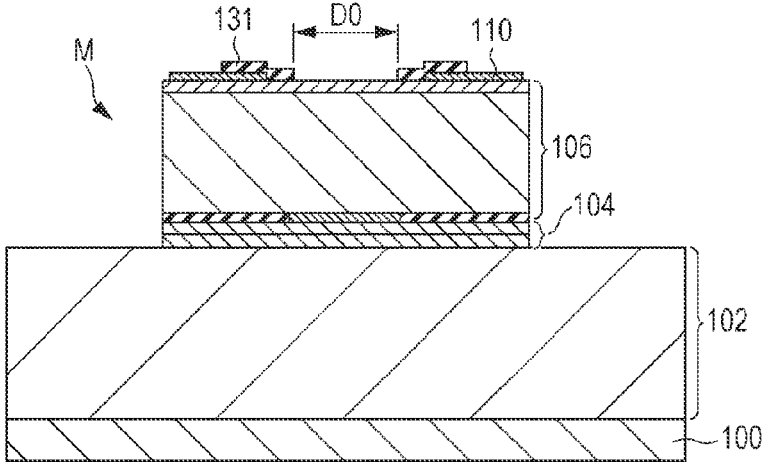

Next, as shown in FIG. 4B, a first insulation film 131 is formed on the entire substrate 100, including the mesa M, by chemical vapor deposition (CVD). The film thickness of the first insulation film 131 is $\lambda/4$, for example. Next, as shown in FIG. 4C, the first insulation film 131 is patterned by etching using a mask pattern (not shown). As described above, the first insulation film 131 is patterned into an annular shape having an inside diameter D0 to expose the contact layer 106A serving as the light emission surface. At this time, the inside diameter D0 of the first insulation film 131 is smaller than the diameter D1 of the conductive area 108B of the current confinement layer 108. In addition, the etching of the first insulation film 131 is performed by an etching method with a high selective etching ratio for a semiconductor layer (GaAs contact layer 106A) such as wet etching that uses buffered hydrogen fluoride (BHF) and dry etching that uses a fluorine-based mixed gas, for example. Although the first insulation film 131 is formed and patterned after the formation of the mesa M here, the first insulation film 131 may be formed and patterned before the formation of the mesa M.

Figure 5D:
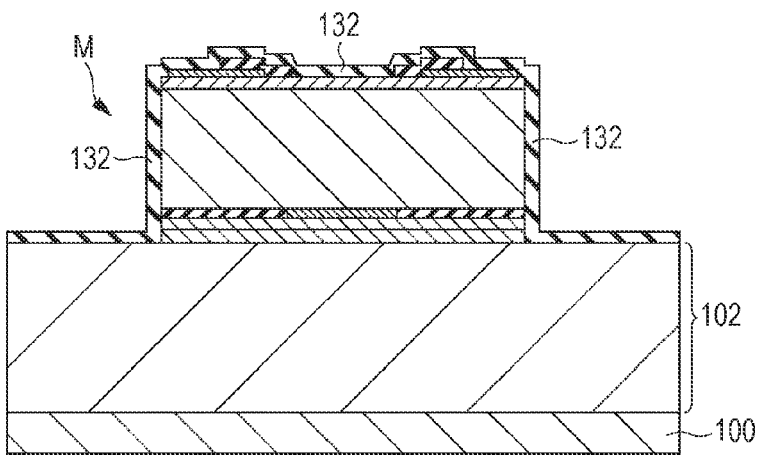
FIGS. 5D to 5F are each a schematic cross-sectional view illustrating manufacturing processes for the surface emitting semiconductor laser according to the second exemplary embodiment of the present invention.
Figure 5E:
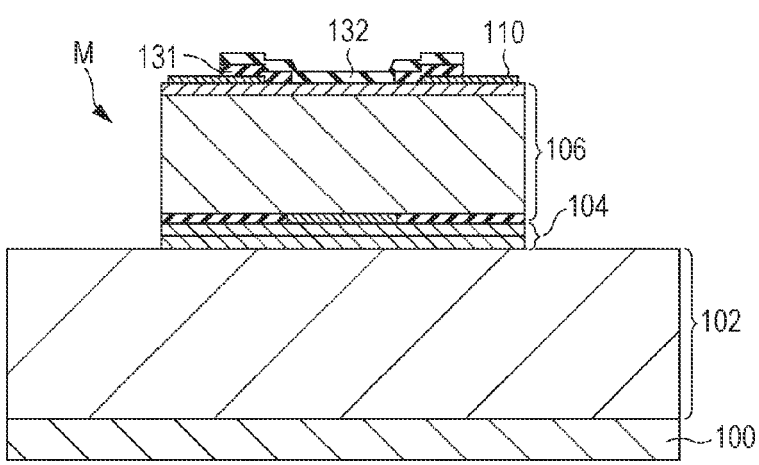

Next, as shown in FIG. 5D, a second insulation film 132 is formed on the entire substrate 100, including the mesa M, by CVD. The film thickness of the second insulation film 132 is an odd number times $\lambda/4$. The second insulation film 132 covers a portion of the light emission surface exposed by the first insulation film 131. Next, as shown in FIG. 5E, the second insulation film 132 is etched into a circular pattern using a mask pattern (not shown). As with the first insulation film 131, the second insulation film 132 may be formed and patterned before the formation of the mesa M.

Figure 5F:
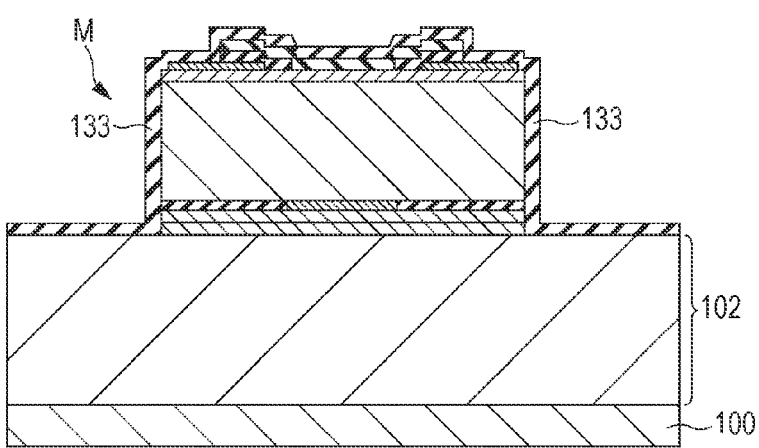

Next, as shown in FIG. 5F, a third insulation film 133 is formed on the entire substrate 100, including the mesa M, by CVD. The film thickness of the third insulation film 133 is an odd number times $\lambda/4$. Next, the third insulation film 133 is etched using a mask pattern (not shown). Consequently, as shown in FIG. 3, the third insulation film 133 is formed on the second insulation film 132, and an interlayer insulation film 112 is formed to cover the bottom surface, the side surface, and the periphery of the top portion of the mesa M.

Figure 6A:
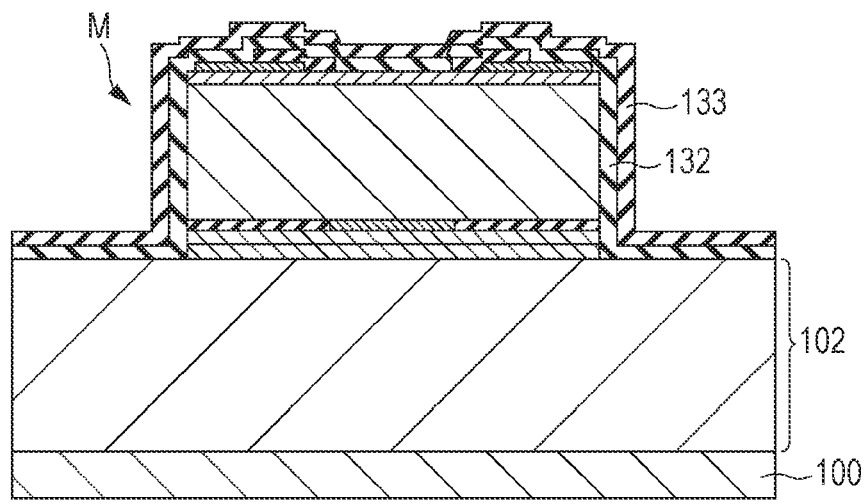
FIGS. 6A and 6B are each a schematic cross-sectional view illustrating other manufacturing processes for the surface emitting semiconductor laser according to the second exemplary embodiment of the present invention.
Figure 6B:
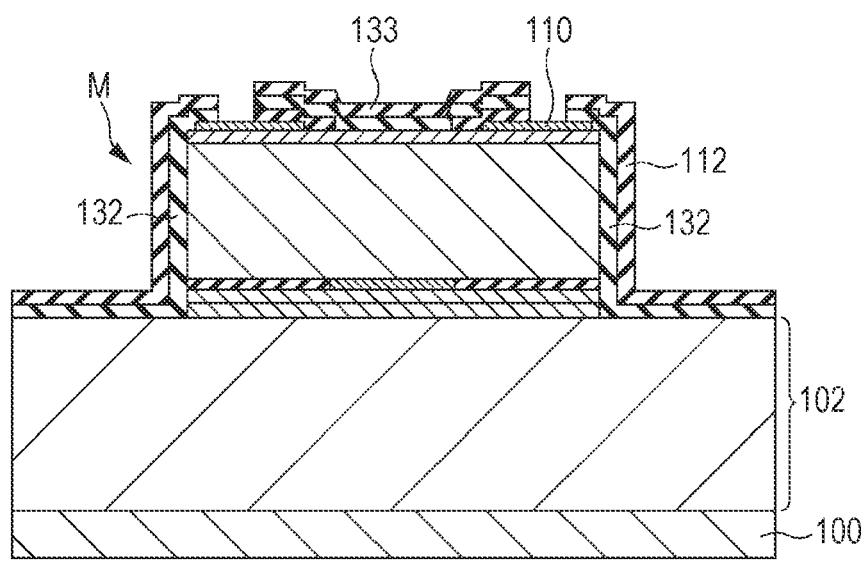

In the manufacturing processes described above, the third insulation film 133 is formed after the second insulation film 132 is processed into a circular pattern. In alternative processes, as shown in FIG. 6A, the second insulation film 132 may be formed, and then the third insulation film 133 may be formed. Thereafter, as shown in FIG. 6B, the second and third insulation films 132 and 133 may be processed by etching at the same time. In this case, the interlayer insulation film 112 has a structure in which the second insulation film 132 and the third insulation film 133 are stacked on each other.

In the exemplary embodiments described above, the GaAs-based VCSELs are formed using semiconductor materials such as GaAs, AlAs, and AlGaAs. However, the present invention may also be applied to VCSELs formed using other compound semiconductors belonging to the III to V groups.

In the exemplary embodiments described above, in addition, an n-type electrode is formed on the back surface of the substrate. However, the n-type electrode may be formed on the same side as the p-side electrode. In the exemplary embodiments described above, further, a single-spot VCSEL is described. However, the present invention may also be applied to a multi-spot VCSEL in which a large number of mesas (light emitting portions) are formed on a substrate, or to an array of VCSELs.

Figure 7A:
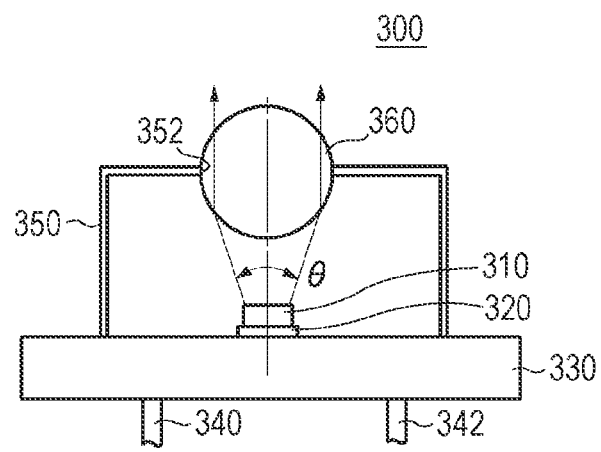
FIGS. 7A and 7B are each a schematic cross-sectional view showing the configuration of a surface emitting semiconductor laser device in which an optical member is mounted to the surface emitting semiconductor laser according to the exemplary embodiment.

Next, a surface emitting semiconductor laser device, an optical information processing device, and an optical transmission device that utilize the VCSEL according to the exemplary embodiment will be described with reference to the drawings. FIG. 7A is a cross-sectional view showing the configuration of a surface emitting semiconductor laser device in which the VCSEL and an optical member are mounted (packaged). In a surface emitting semiconductor laser device 300, a chip 310 on which the VCSEL is formed is fixed on a metal disk-like stem 330 via a conductive adhesive 320. Conductive leads 340 and 342 are inserted into through holes (not shown) formed in the stem 330. One of the leads 340 is electrically connected to the n-type electrode of the VCSEL, and the other lead 342 is electrically connected to the p-side electrode.

A hollow rectangular cap 350 is fixed on the stem 330, including the chip 310. A ball lens 360 serving as the optical member is fixed in an opening 352 provided in the center of the cap 350. The optical axis of the ball lens 360 is positioned so as to substantially match the center of the chip 310. When a voltage in the forward direction is applied between the leads 340 and 342, laser light is emitted from the chip 310 in the vertical direction. The distance between the chip 310 and the ball lens 360 is adjusted such that the ball lens 360 is located within the angle of divergence $\theta$ of the laser light from the chip 310. In addition, a light receiving element that monitors the light emission state of the VCSEL or a temperature sensor may be provided in the cap.

Figure 7B:
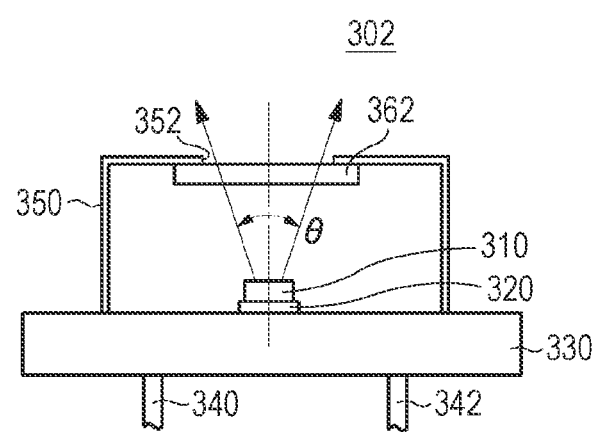

FIG. 7B shows the configuration of another surface emitting semiconductor laser device. In a surface emitting semiconductor laser device 302 shown in the drawing, a flat glass plate 362 is fixed in the opening 352 provided in the center of the cap 350 in place of the ball lens 360. The center of the flat glass plate 362 is positioned so as to substantially match the center of the chip 310. The distance between the chip 310 and the flat glass plate 362 is adjusted such that the opening diameter of the flat glass plate 362 is larger than the angle of divergence $\theta$ of the laser light from the chip 310.

Figure 8:
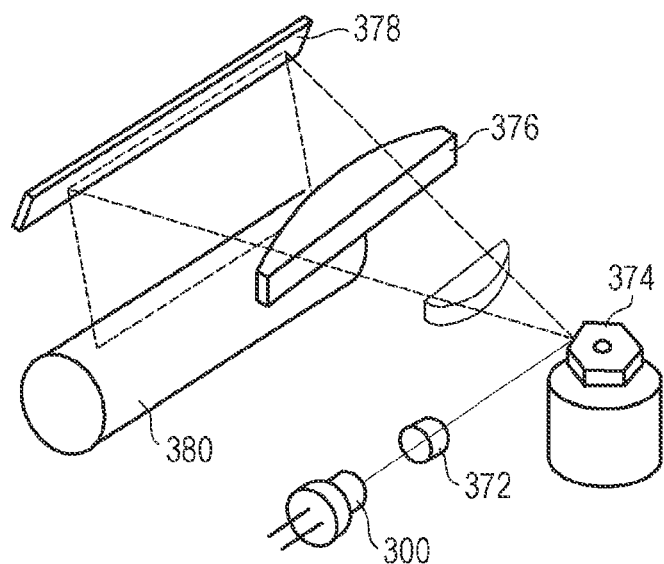
FIG. 8 shows an example of the configuration of a light source device that uses the surface emitting semiconductor laser according to the exemplary embodiment.

FIG. 8 shows an example in which the VCSEL is applied to a light source of an optical information processing device. An optical information processing device 370 includes a collimator lens 372 that receives laser light from the surface emitting semiconductor laser device 300 or 302 in which the VCSEL is mounted as shown in FIG. 7A or 7B, a polygon mirror 374 that rotates at a constant speed to reflect a pencil of light rays from the collimator lens 372 at a constant angle of divergence, an fθ lens 376 that receives laser light from the polygon mirror 374, a linear reflective mirror 378 irradiated by the fθ lens 376, and a photoconductor drum (recording medium) 380 that forms a latent image on the basis of light reflected from the reflective mirror 378. In this way, the VCSEL may be utilized as a light source of the optical information processing device such as a copier and a printer including an optical system that condenses laser light from the VCSEL onto the photoconductor drum and a mechanism that scans the photoconductor drum with the condensed laser light.

Figure 9:
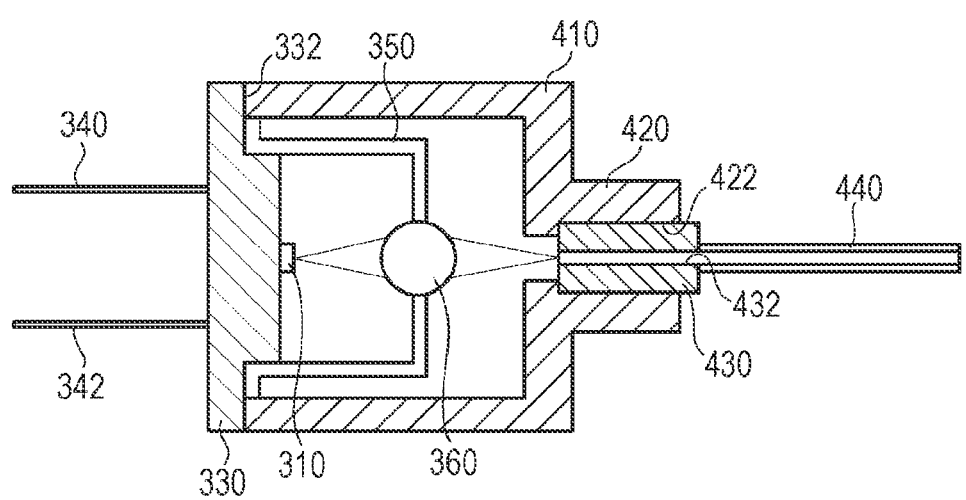
FIG. 9 is a schematic cross-sectional view showing the configuration of an optical transmission device that uses the surface emitting semiconductor laser device shown in FIG. 7A.

FIG. 9 is a cross-sectional view showing the configuration of an optical transmission device that uses the surface emitting semiconductor laser device shown in FIG. 7A. An optical transmission device 400 includes a cylindrical housing 410 fixed to the stem 330, a sleeve 420 formed integrally on an end surface of the housing 410, a ferrule 430 held in an opening 422 of the sleeve 420, and an optical fiber 440 held by the ferrule 430. An end portion of the housing 410 is fixed to a flange 332 formed at the circumference of the stem 330. The ferrule 430 is accurately positioned in the opening 422 of the sleeve 420 so as to align the optical axis of the optical fiber 440 with the optical axis of the ball lens 360. The core wire of the optical fiber 440 is held in a through hole 432 of the ferrule 430.

Laser light emitted from the surface of the chip 310 is condensed by the ball lens 360. The condensed light is incident into the core wire of the optical fiber 440 to be transmitted. Although the ball lens 360 is used in the example described above, other lenses such as a double-convex lens and a plano-convex lens may also be used. In addition, the optical transmission device 400 may include a drive circuit that applies an electrical signal to the leads 340 and 342. Further, the optical transmission device 400 may include a reception function for receiving an optical signal via the optical fiber 440.

While exemplary embodiments of the present invention have been described in detail above, the present invention is not limited to particular exemplary embodiments, and various modifications and alterations may be made within the scope and spirit of the present invention described in the claims.

What is claimed is:

1. A surface emitting semiconductor laser including, provided on a substrate, a first semiconductor multilayer reflector of a first conductivity type, an active area, a second semiconductor multilayer reflector of a second conductivity type, and a current confinement layer having a conductive area and a surrounding high-resistance area, the surface emitting semiconductor laser comprising:
   a higher-order transverse mode suppressing layer formed on an emission surface from which laser light is emitted and in an area in which higher-order transverse mode is induced,
   wherein the higher-order transverse mode suppressing layer includes a first insulation film, a second insulation film formed on the first insulation film, and a third insulation film formed on the second insulation film, the first insulation film having a first refractive index and capable of transmitting an oscillation wavelength, the second insulation film having a second refractive index and capable of transmitting the oscillation wavelength, and the third insulation film having a third refractive index and capable of transmitting the oscillation wavelength, and
   the second refractive index is lower than the first refractive index, the third refractive index is higher than the second refractive index, and an optical film thickness of the first insulation film, the second insulation film, and the third insulation film is an odd number times one-fourth of the oscillation wavelength.

2. The surface emitting semiconductor laser according to claim 1, further comprising:
   a fundamental transverse mode promoting layer formed on the emission surface from which laser light is emitted and in an area in which fundamental transverse mode is induced,
   wherein the fundamental transverse mode promoting layer is positioned inside the higher-order transverse mode suppressing layer, and includes the second insulation film provided on a portion of the emission surface exposed by the first insulation film, and the third insulation film provided on the second insulation film.

3. The surface emitting semiconductor laser according to claim 1,
   wherein the higher-order transverse mode suppressing layer has an inside diameter D0 for exposure of the emission surface, and the conductive area of the current confinement layer has a diameter D1, D1 being larger than D0.

4. The surface emitting semiconductor laser according to claim 1,
   wherein a film thickness h1 of the first insulation film meets the following relation:

$$h1 = \frac{\lambda}{4n_1}(2i+1)$$

and $$\cos\left[\frac{2\pi h1}{\lambda}(n_0 - n_1)\right] \geq 0.8$$

where $\lambda$ is the oscillation wavelength, $n_1$ is the refractive index of the first insulation film, i is an integer, and $n_0$ is the refractive index of air.

5. The surface emitting semiconductor laser according to claim 1,
   wherein the reflectivity of the second semiconductor multilayer reflector, including the higher-order transverse mode suppressing layer, in an area in which the higher-order transverse mode suppressing layer is formed is lower by at least about 2% or more than the reflectivity of the second semiconductor multilayer reflector or the reflectivity of the second semiconductor multilayer reflector, including the fundamental transverse mode promoting layer, in an area in which the fundamental transverse mode promoting layer is formed.

6. The surface emitting semiconductor laser according to claim 1, further comprising:
   a columnar structure that leads to the current confinement layer,
   wherein the third insulation film covers a bottom surface, a side surface, and a periphery of a top portion of the columnar structure.

7. The surface emitting semiconductor laser according to claim 1,
   wherein the current confinement layer includes a conductive area and a surrounding selectively oxidized area, and the conductive area has a diameter D1 of more than at least about 3 μm.

8. A manufacturing method for a surface emitting semiconductor laser including, provided on a substrate, a first semiconductor multilayer reflector of a first conductivity type, an active area, a second semiconductor multilayer reflector of a second conductivity type, and a current confinement layer having a conductive area and a surrounding high-resistance area, the manufacturing method comprising:
   forming, on an emission surface from which laser light is emitted, a first insulation film having a first refractive index and capable of transmitting an oscillation wavelength;
   forming an opening with an inside diameter D0 in the first insulation film such that the first insulation film remains on the emission surface and in an area in which higher-order transverse mode is induced;

forming, on the first insulation film including the opening, a second insulation film having a second refractive index and capable of transmitting the oscillation wavelength; and forming, on the second insulation film, a third insulation film having a third refractive index and capable of transmitting the oscillation wavelength, the second refractive index is lower than the first refractive index, the third refractive index is higher than the second refractive index, and an optical film thickness of the first insulation film, the second insulation film, and the third insulation film is an odd number times one-fourth of the oscillation wavelength.

9. The manufacturing method according to claim 8, further comprising:

forming a columnar structure that leads to the current confinement layer and selectively oxidizing the current confinement layer from a side surface of the columnar structure to form the high-resistance area, wherein the conductive area has a diameter D1, D1 being larger than D0.

10. The manufacturing method according to claim 8, wherein the optical film thickness of the first insulation film is an integral multiple of nine-fourths of the oscillation wavelength.

11. The manufacturing method according to claim 9, further comprising:

processing at least the third insulation film such that the processed third insulation film covers the area in which the higher-order transverse mode is induced and a bottom surface, a side surface, and a periphery of a top portion of the columnar structure.

12. A surface emitting semiconductor laser device comprising:

the surface emitting semiconductor laser according to claim 1; and an optical member that receives light from the surface emitting semiconductor laser.

13. An optical transmission device comprising:

the surface emitting semiconductor laser device according to claim 12; and a transmission unit that transmits via an optical medium laser light emitted from the surface emitting semiconductor laser device.

14. An information processing device comprising:

the surface emitting semiconductor laser according to claim 1;

a condensing device that condenses on a recording medium laser light emitted from the surface emitting semiconductor laser; and a mechanism that scans the recording medium with the laser light condensed by the condensing device.

* * * * *